(12) United States Patent  (10) Patent No.: US 12,501,642 B2
Arkun et al.  (45) Date of Patent: Dec. 16, 2025

(54) SEMICONDUCTOR MATERIALS AND DEVICES INCLUDING III-NITRIDE LAYERS INTEGRATED WITH SCANDIUM ALUMINUM NITRIDE

(71) Applicant: HRL Laboratories, LLC, Malibu, CA (US)

(72) Inventors: Fevzi Arkun, Camarillo, CA (US); Hasan Sharifi, Agoura Hills, CA (US); Samuel Whiteley, Santa Monica, CA (US)

(73) Assignee: HRL Laboratories, LLC, Malibu, CA (US)

( * ) Notice: Subject to any disclaimer, the term of this patent is extended or adjusted under 35 U.S.C. 154(b) by 1079 days.

(21) Appl. No.: 17/065,205

(22) Filed: Oct. 7, 2020

(65) Prior Publication Data

US 2022/0109064 A1 Apr. 7, 2022

(51) Int. Cl.
  H10D 30/47 (2025.01)
  H10D 30/01 (2025.01)
  H10D 62/85 (2025.01)

(52) U.S. Cl.
  CPC .......... H10D 30/47 (2025.01); H10D 30/015 (2025.01); H10D 30/475 (2025.01); H10D 30/4755 (2025.01); H10D 62/8503 (2025.01)

(58) Field of Classification Search
  CPC . H01L 29/7787; H01L 29/7786; H10D 30/47; H10D 30/475; H10D 30/4755
  See application file for complete search history.

(56) References Cited

U.S. PATENT DOCUMENTS

| | | |
|---|---|---|
| 7,112,860 B2 | 9/2006 | Saxler |
| 7,296,329 B1 | 11/2007 | Barber et al. |
| 8,796,736 B1 | 8/2014 | Brown et al. |
| 9,419,124 B2 | 8/2016 | Parikh et al. |
| 10,636,881 B2 | 4/2020 | Beam, III et al. |
| 2012/0206216 A1 | 8/2012 | Deguet et al. |
| 2014/0124792 A1* | 5/2014 | Hagleitner ......... H10D 30/6738 257/77 |
| 2014/0264365 A1* | 9/2014 | Wong .................. H01L 21/8252 438/172 |

(Continued)

FOREIGN PATENT DOCUMENTS

WO 2011042388 A1 4/2011

OTHER PUBLICATIONS

Eastman, L. "Undoped AlGaN/GaN HEMTs for Microwave Power Amplification" IEEE Trans. on elec. Dev. vol. 48, No. 3, Mar. 2001 pp. 479-485 (Year: 2001).*

(Continued)

*Primary Examiner* — Grant S Withers
(74) *Attorney, Agent, or Firm* — Wheatstone IP Law Corporation; Milad G. Shara

(57) ABSTRACT

A $Sc_xAl_{1-x}N$ based filter may include a $Sc_xAl_{1-x}N$ material formed directly on a III-N material. The III-N material may include an n-type III-N layer or a III-N heterostructure having a 2DEG therein. The $Sc_xAl_{1-x}N$ based filter may be monolithically integrated with a III-N device such as a HEMT device to form a monolithically integrated circuit.

18 Claims, 22 Drawing Sheets

(56) References Cited

U.S. PATENT DOCUMENTS

| | | | | |
|---|---|---|---|---|
| 2015/0263700 A1* | 9/2015 | Yasumoto | ............... | H01L 28/20 310/313 B |
| 2019/0199322 A1 | 6/2019 | Dasgupta et al. | | |
| 2020/0220000 A1* | 7/2020 | Liu | ..................... | H01L 29/0843 |
| 2021/0359118 A1* | 11/2021 | Radulescu | .......... | H01L 29/7787 |
| 2021/0399119 A1* | 12/2021 | Vishwanath | .......... | H01L 29/201 |
| 2023/0290834 A1* | 9/2023 | Xie | ..................... | H01L 29/2003 |

OTHER PUBLICATIONS

Akasaki, I. "Conductivity control of GaN and fabrication of UV/blue GaN light emitting devices" Physica B 185 Apr. 1993 pp. 428-432 (Year: 1993).*

Frie, K. "Investigation of growth parameters for ScAlN-barrier HEMT structures by plasma-assisted MBE" Jap. Journ. Of App. Phys. 58, May 22, 2019 pp. SC1045-1 through SC1045-6 (Year: 2019).*

K. Frei et al.; "Investigation of growth parameters for ScAlN-barrier HEMT structures by plasma-assisted MBE", Jpn. J. Appl. Physics 58 SC1045 (2019), pp. 1-7, May 22, 2019, https://doi.org/10.7567/1347-4065/ab124f.

S. Fujii et al.; "Deposition of highly c-axis-oriented ScAlN thin films by RF magnetron sputtering using a Sc-Al alloy target", Organization for Academic-Industrial Collaboration and Intellectual Property, Chiba University, Chiba, Japan, pp. 1-4, 2014 IEEE International Frequency Control Symposium.

M. T. Hardy et al.; "Epitaxial ScAlN grown by molecular beam epitaxy on GaN and SiC substrates", Appl. Phys. Lett. 110, 162104 (2017), pp. 1-6, Apr. 20, 2017, https://doi.org/10.1063/1.4981807.

M. T. Hardy et al.; "ScAlN: A Novel Barrier Material for High Power GaN-Based RF Transistors", ECS Transactions, 80 (7) (2017), pp. 161-168.

Zhu et al., "Unintentional Doping in GaN" Phys. Chem. Chem. Phys., 2012, 14, 9558-9573.

Khan et al., "High Electron Mobility Transistor Based on a GaN-AlxGa1-xN Heterostructure" Appl. Phys. Lett. 63, 1214-1215, Aug. 30, 1993.

* cited by examiner

First

Second

Fourth

Fifth

First

Second

Third

Fourth

SEMICONDUCTOR MATERIALS AND DEVICES INCLUDING III-NITRIDE LAYERS INTEGRATED WITH SCANDIUM ALUMINUM NITRIDE

TECHNICAL FIELD

This disclosure relates to semiconductor devices and materials, in particular to filters and resonators for use in RF circuits.

BACKGROUND

Acoustic wave devices are a class of devices in which acoustic waves traveling through a piezoelectric material are transformed into electromagnetic waves. Piezoelectric materials are characterized in that a mechanical strain in the material induces an electric field across the material, and an applied electric field induces mechanical strain across the material. A time-varying electric field (e.g., caused by an electromagnetic wave) applied to a portion of a piezoelectric material may induce a mechanical wave that propagates through the material. The electromagnetic waves that induce the mechanical waves in the piezoelectric material may be applied via one or more input electrodes deposited on the material.

Acoustic waves may travel through solid materials in a number of modes. For example, they may travel through the bulk of the material (bulk waves) or along the surface of the material (surface waves). Acoustic wave devices that transmit bulk waves are typically referred to as bulk acoustic wave devices, or BAWs, and acoustic wave devices that transmit surface waves are typically referred to as surface acoustic wave devices, or SAWs. The specific geometry and material properties of the piezoelectric material in a BAW or SAW device determine its resonant modes. A BAW or SAW device may be used as a resonator or filter for selective transmission of RF electromagnetic signals.

SUMMARY

A semiconductor device according to an example embodiment comprises a substrate, an n-type III-N layer over the substrate, a $Sc_xAl_{1-x}N$ layer over the n-type III-N layer, a first electrode contacting the n-type III-N layer, and a second electrode on the $Sc_xAl_{1-x}N$ layer. The value x in the $Sc_xAl_{1-x}N$ layer is $0<x<1$. The $Sc_xAl_{1-x}N$ layer may include an aperture and the first electrode may be disposed at least partially in the aperture. The semiconductor device in this example may include a third electrode on the $Sc_xAl_{1-x}N$ layer. The third electrode may be electrically connected to the first electrode. The $Sc_xAl_{1-x}N$ layer may include a recess between the second and third electrodes.

A semiconductor device according to another example embodiment includes a substrate and a III-N material over the substrate. The III-N material includes a III-N barrier layer having a first composition and a III-N channel layer having a second composition that is different from the first composition. The semiconductor device further includes a two-dimensional electron gas in the III-N channel layer, and a $Sc_xAl_{1-x}N$ layer over the III-N material. The value x in the $Sc_xAl_{1-x}N$ layer is $0<x<1$.

The semiconductor device may include an n-type III-N layer between the $Sc_xAl_{1-x}N$ layer and the III-N material, wherein the value x may be $0.1 \leq x \leq 0.25$ and the $Sc_xAl_{1-x}N$ layer is a single-crystalline film. A first electrode may be coupled to the III-N material and a second electrode is formed on the $Sc_xAl_{1-x}N$ layer. An n-type III-N layer may be formed between the $Sc_xAl_{1-x}N$ layer and the III-N material. A third electrode may be formed on the $Sc_xAl_{1-x}N$ layer. The $Sc_xAl_{1-x}N$ layer may have a recess between the second and third electrodes. The first electrode may form an ohmic contact to the two-dimensional electron gas. Also, the first electrode forms a Schottky contact to the III-N material. An insulating material may be formed between the first electrode and the III-N material.

A semiconductor device according to another example embodiment includes a substrate and a III-N material over the substrate. The III-N material includes a first region that is part of a first device and a second region that is part of a second device, wherein a recess is formed in the III-N material between the first and second regions. The first device includes a $Sc_xAl_{1-x}N$ layer over a portion of the first region of the III-N material. The second device comprises source and drain electrodes, and a gate electrode between the source and drain electrodes. The value x in the $Sc_xAl_{1-x}N$ layer is $0<x<1$. The first device may include a filter and the second device may include a transistor.

The III-N material may include a III-N barrier layer, a III-N channel layer, a two-dimensional electron gas in the III-N channel layer, and the recess extending through the two-dimensional electron gas. The III-N barrier layer has a first composition and the III-N channel layer has a second composition that is different from the first composition. The $Sc_xAl_{1-x}N$ layer may include a plurality of $Sc_xAl_{1-x}N$ mesas. Each of the $Sc_xAl_{1-x}N$ mesas may include at least one electrode formed thereon.

An example method of forming a semiconductor device includes forming a III-N material over a substrate and forming a mask over the III-N material. The mask includes an aperture over a first portion of a surface of the III-N material. The method includes forming a $Sc_xAl_{1-x}N$ layer over the III-N material in the aperture and removing the mask to expose a second portion of the III-N material. The value x in the $Sc_xAl_{1-x}N$ wherein $0<x<1$. The III-N material may include a III-N barrier layer having a first composition, a III-N channel layer having a second composition, and a two-dimensional electron gas formed in the III-N channel layer. The III-N barrier layer has a first composition and the III-N channel layer has a second composition that is different from the first composition. The III-N material may include an n-type III-N layer.

DESCRIPTION OF DRAWINGS

Like reference symbols in the various figures indicate like elements.

DETAILED DESCRIPTION

FIGS. 1-16J illustrate example embodiments of semiconductor materials and devices that have a $Sc_xAl_{1-x}N$ layer formed directly on one or more III-N layers of a III-N semiconductor device. The $Sc_xAl_{1-x}N$ layer and the III-N layers may each be patterned to form devices and circuits including $Sc_xAl_{1-x}N$ based devices such as filters and resonators that are monolithically integrated with III-N devices such as III-N high electron mobility transistors (HEMTs). The III-Nitride or III-N materials, layers, devices, and structures include a material, device, or structure comprised of a compound semiconductor material according to the stoichiometric formula $Al_wIn_yGa_zN$, where w+y+z is about 1, 0≤w≤1, 0≤y≤1, and 0≤z≤1. In a III-Nitride or III-N device such as a transistor (e.g., a high electron mobility transistor or HEMT), the conductive channel of the device may be partially or entirely contained within a III-N material layer.

The material $Sc_xAl_{1-x}N$ (where x is between 0 and 1 and represents the molar fractional composition of Sc relative to the combined molar composition of Sc and Al in the material) has high piezoelectric coefficients, making it suited as the active material in acoustic wave devices. Acoustic wave devices based on $Sc_xAl_{1-x}N$ may be used as resonators and/or filters in circuits with III-N based RF devices. Furthermore, $Sc_{0.18}Al_{0.82}N$ is lattice matched to GaN, which may allow for high quality single-crystalline $Sc_xAl_{1-x}N$ films with x close to 0.18 to be epitaxially grown on top of III-N materials such GaN. $Sc_xAl_{1-x}N$ films may therefore be formed directly on the III-N material structure of a III-N device, thereby allowing the acoustic wave devices to be monolithically integrated with the III-N devices. This can reduce the size and cost as well as improve the performance of the resulting RF circuits.

Figure 1A:
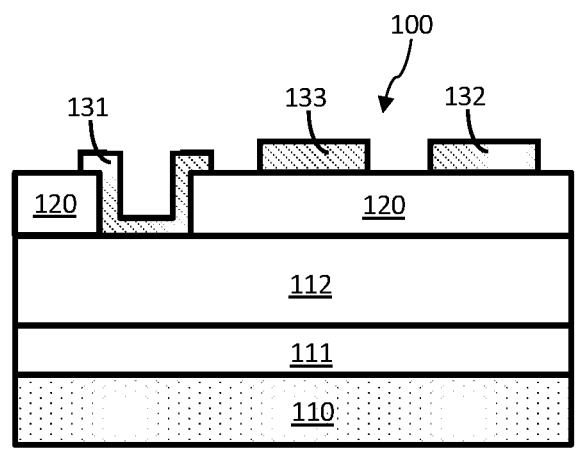
FIGS. 1A and 2-3 are schematic diagrams for example embodiments of semiconductor devices including a $Sc_xAl_{1-x}N$ layer formed on an n-type III-N layer.

Referring to FIG. 1A, a semiconductor device 100 according to an example embodiment includes a substrate 110, an n-type III-N layer 112 over substrate 110, and a $Sc_xAl_{1-x}N$ layer 120 over n-type III-N layer 112. A first electrode 131 contacts n-type III-N layer 112, and a second electrode 132 is on $Sc_xAl_{1-x}N$ layer 120.

Substrate 110 may be formed of any material suitable for the growth of III-N materials thereon, for example silicon carbide (SiC), silicon (Si), gallium nitride (GaN), aluminum nitride (AlN), or sapphire. The substrate may be crystalline and may be cleaved along a crystalline plane, or alternatively may be an offcut substrate. For many high power RF applications, substrate 110 may be formed of a high thermal conductivity material such as SiC. When substrate 110 is a foreign substrate such as a Si, SiC, or sapphire substrate, a III-N buffer layer 111 such as AlN may be included between n-type III-N layer 112 and substrate 110. III-N buffer layer 111 may enable epitaxial growth of high quality III-N material thereover. The n-type III-N layer 112 may, for example, be an n+ GaN layer (where n+ indicates that the layer is highly doped n-type, for example with a donor concentration greater than $10^{18}$ cm$^{-3}$).

The III-N buffer layer 111, n-type III-N layer 112, and $Sc_xAl_{1-x}N$ layer 120 may each be epitaxially grown, for example by metalorganic chemical vapor deposition (MOCVD) or molecular beam epitaxy (MBE). In particular, epitaxial growth of $Sc_xAl_{1-x}N$ layer 120 directly on III-N materials may result in a single-crystalline film. In order to prevent stress induced defects such as dislocations in $Sc_xAl_{1-x}N$ layer 120, the scandium composition x may be selected such that $Sc_xAl_{1-x}N$ layer 120 has the same or almost the same lattice constant as the underlying III-N buffer layer 111 or n-type III-N layer 112. For example, x may be in a range of 0.05 to 0.4, 0.07 to 0.35, 0.09 to 0.3, or 0.1 to 0.25. III-N buffer layer 111 may be in a range of 15 nm to 3 microns thick (e.g., 15 nm to 50 nm thick), n-type III-N layer 112 may be in a range of 200 nm to 500 nm thick, and $Sc_xAl_{1-x}N$ layer 120 may be in a range of 50 nm to 300 nm thick.

During epitaxial growth of $Sc_xAl_{1-x}N$ layer 120, a surfactant such as indium, gallium, or a precursor that includes indium or gallium may be injected into the growth reactor. This may in some cases result in improved crystallinity of $Sc_xAl_{1-x}N$ layer 120. When an indium or gallium containing precursor is injected during the growth of $Sc_xAl_{1-x}N$ layer 120, a small amount of indium or gallium may be incorporated into $Sc_xAl_{1-x}N$ layer 120. Accordingly, $Sc_xAl_{1-x}N$ layer 120 may include indium, gallium, or other dopants or impurities at a molar concentration smaller than 1% of the combined molar concentration of scandium, aluminum, and nitrogen in the layer. Furthermore, $Sc_xAl_{1-x}N$ layer 120 may be configured such that x varies throughout the layer. For example, x may be graded, such that $Sc_xAl_{1-x}N$ layer 120 is a graded layer.

The first and second electrodes 131 and 132, respectively, may each comprise a metal or polycrystalline material. Electrode 131 may be at least partially in an aperture formed in $Sc_xAl_{1-x}N$ layer 120. Electrode 131 may form an ohmic contact to the n-type III-N layer 112. Semiconductor device 100 may optionally include a third electrode 133 formed of a suitable metal or polycrystalline material that is also on $Sc_xAl_{1-x}N$ layer 120.

Figure 1B:
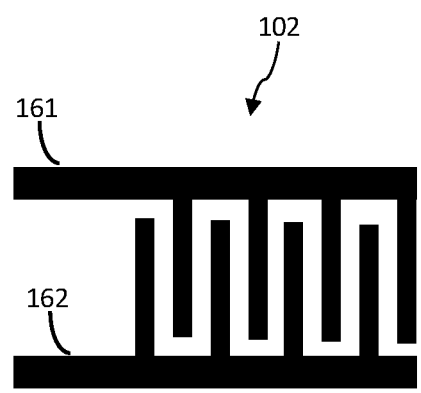
FIG. 1B is a schematic diagram of an interdigital transducer used in the semiconductor device of FIG. 1A.

In an example embodiment of semiconductor device 100, second and third electrodes 132 and 133 may each be formed as or be a part of an interdigital electrode structure 102 (typically known as an interdigital transducer or IDT) shown in FIG. 1B. That is, second and third electrodes 132 and 133 may each include two interdigital electrodes 161 and 162. IDTs may be used as input and/or output electrodes of acoustic wave devices.

$Sc_xAl_{1-x}N$ layer 120 along with electrodes 132 and 133 (when included) may form a surface acoustic wave (SAW) device. For example, electrodes 132 and 133 may each be formed as interdigital transducers, and an input RF signal at one of the electrodes 132 or 133 may generate an acoustic wave that travels along the surface of $Sc_xAl_{1-x}N$ layer 120, thereby causing a transmitted electromagnetic wave that corresponds to the transmitted acoustic wave to be received at the other electrode 132 or 133.

Figure 2:
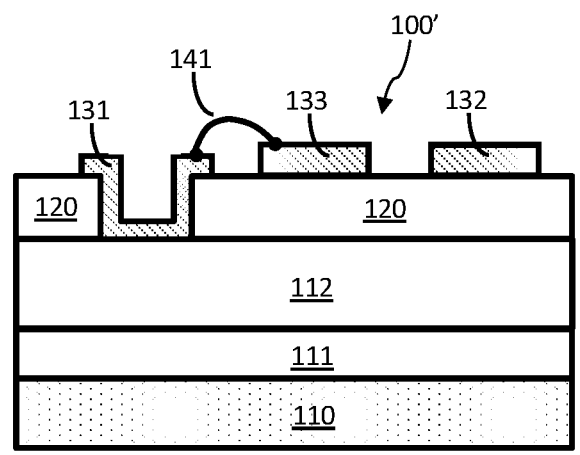

FIG. 2 is an illustration of a semiconductor device 100' that is an example embodiment of semiconductor device 100 in which the third electrode 133 is electrically connected to first electrode 131, for example via bond wire 141. Bond wire 141 may comprise a material which is sufficiently conductive to ensure that the electric potential at each of the electrodes 131 and 133 is the same or about the same at all times under any bias conditions. This configuration may allow RF signals transmitted through n-type III-N layer 112 to pass through first electrode 131 to third electrode 133 and serve as the input to a SAW device having $Sc_xAl_{1-x}N$ layer 120, second electrode 132, and third electrode 133. Alternatively, an RF signal that is input at second electrode 132 and output at third electrode 133 may be transmitted into n-type III-N layer 112 through first electrode 131. Accordingly, in this configuration first electrode 131 may form an ohmic contact to n-type III-N layer 112.

Figure 3:
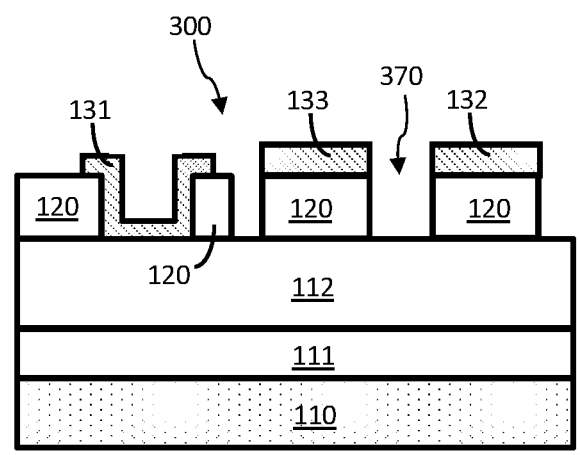

FIG. 3 is an illustration of a semiconductor device 300 that is an example embodiment of semiconductor device 100 in which $Sc_xAl_{1-x}N$ layer 120 includes a recess 370 between second electrode 132 and third electrode 133. Recess 370 may extend through the entire thickness of $Sc_xAl_{1-x}N$ layer 120, thereby defining a plurality of $Sc_xAl_{1-x}N$ mesas each having one or more electrodes formed thereon. In this embodiment, semiconductor device 300 may be operated as a multi-mode bulk acoustic wave (BAW) device. For example, a signal may be input at third electrode 133, generating a bulk acoustic wave that propagates downwards through the underlying $Sc_xAl_{1-x}N$ layer 120 into n-type III-N layer 112 and then back up through $Sc_xAl_{1-x}N$ layer 120 beneath second electrode 132, after which it is output through second electrode 132. Similarly, a signal input at second electrode 132 may generate a bulk acoustic wave that generates an output signal at third electrode 133. Alternatively, an input signal at either second electrode 132 or third electrode 133 may create a bulk acoustic wave passing through the underlying $Sc_xAl_{1-x}N$ layer 120 that then travels through the underlying n-type III-N layer 112 and is output at first electrode 131. Alternatively, semiconductor device 300 may include additional $Sc_xAl_{1-x}N$ mesas with overlying electrodes 132 or 133. As such, depending on the mode of operation for semiconductor device 300, different resonant modes may be applied to an input signal by the BAW filter.

Figure 4:
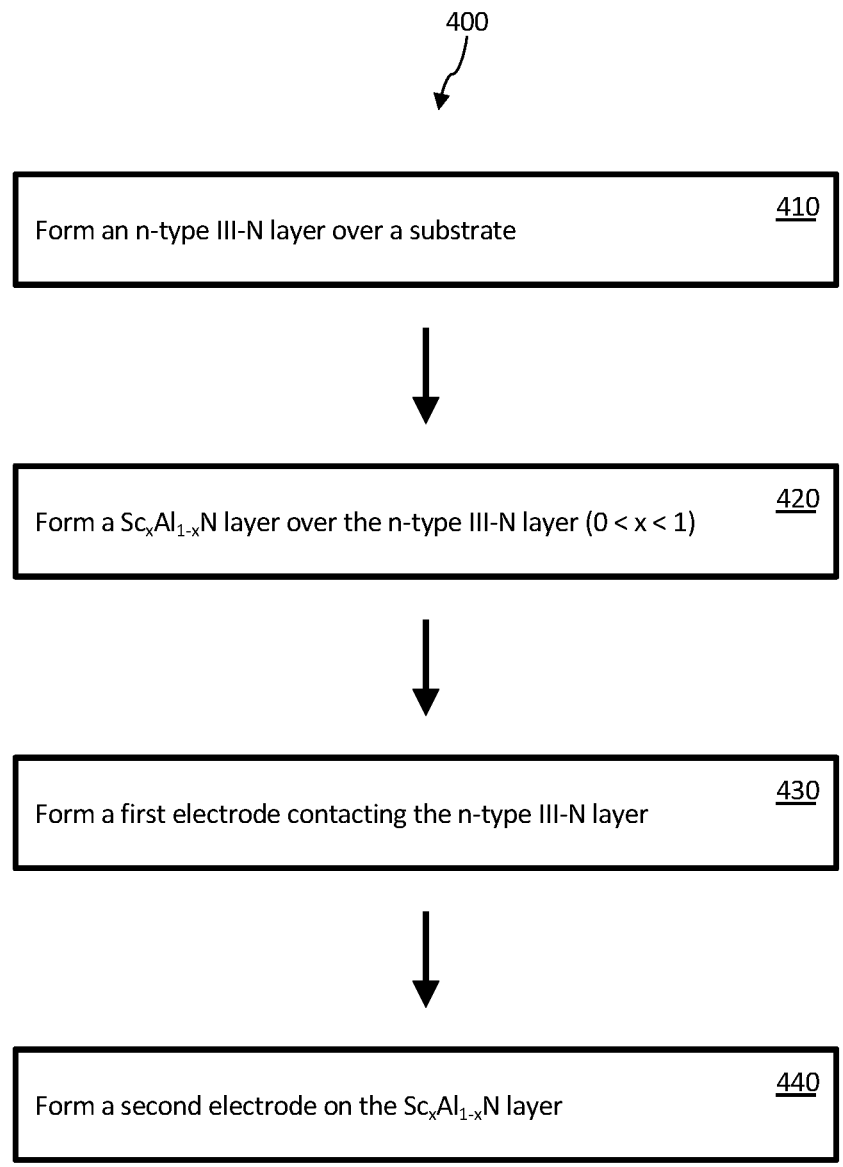
FIGS. 4 and 5A-5F illustrate an example method for forming the semiconductor device of FIG. 1.
Figure 5A:
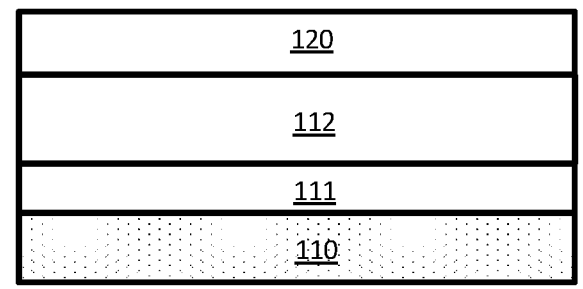
Figure 5B:
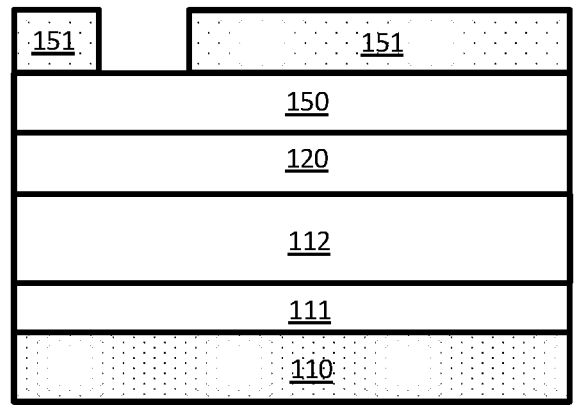
Figure 5C:
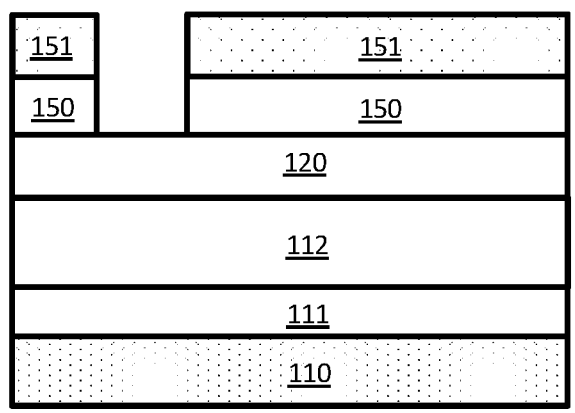
Figure 5D:
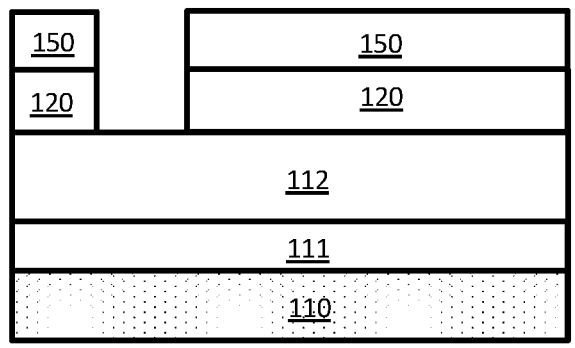
Figure 5E:
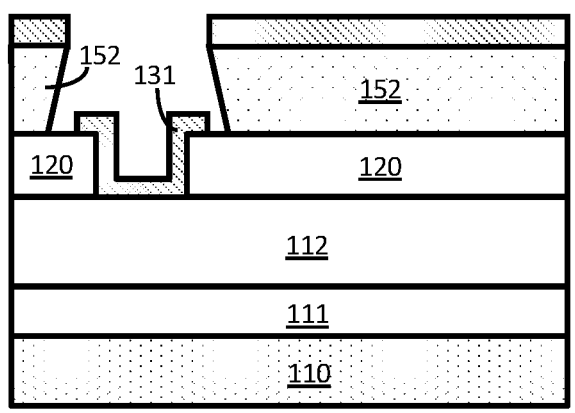
Figure 5F:
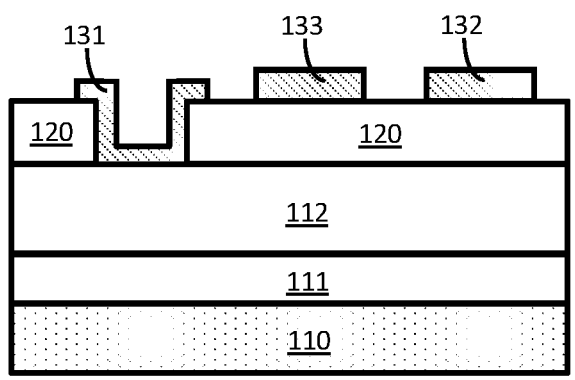

FIG. 4 illustrates an example method 400 for forming semiconductor device 100. Method 400 includes forming (step 410) an n-type III-N layer 112 over a substrate 110, forming (step 420) a $Sc_xAl_{1-x}N$ layer 120 over n-type III-N layer 112, forming (step 430) a first electrode 131 contacting n-type III-N layer 112, and forming (step 440) a second electrode 132 on $Sc_xAl_{1-x}N$ layer 120.

FIGS. 5A-5F show an example embodiment of method 300 for forming semiconductor device 100. First (FIG. 5A), III-N buffer layer 111 (when included), n-type III-N layer 112, and $Sc_xAl_{1-x}N$ layer 120 are sequentially grown on substrate 110 by an epitaxial technique such as MBE or MOCVD. Second (FIG. 5B), a first mask layer 150, which may for example be $SiO_2$ and may have a thickness of about 100 nm, is deposited over $Sc_xAl_{1-x}N$ layer 120, and a photoresist mask 151 is deposited and patterned over mask layer 150. Third (FIG. 5C), the portion of first mask layer 150 that is directly below openings in photoresist mask 151 is then etched via dry or wet etching. Fourth, photoresist mask 151 is removed, and first mask layer 150 is used as an etch mask to remove the portion of $Sc_xAl_{1-x}N$ layer 120 directly below the openings in first mask layer 150 and form an aperture. Fifth (FIG. 5E), first mask layer 150 is removed, a second photoresist mask 152 is then deposited on the wafer and patterned to expose the aperture in $Sc_xAl_{1-x}N$ layer 120, and a metal layer is deposited in the aperture and over second photoresist mask 152. Sixth (FIG. 5F), second photoresist mask 152 and overlying metal are removed, and first electrode 132 and second electrode 133 are deposited on $Sc_xAl_{1-x}N$ layer 120, thereby forming semiconductor device 100. Method 400 (FIGS. 5A-5F) may be configured to form semiconductor device 100' and semiconductor device 300.

Figure 6A:
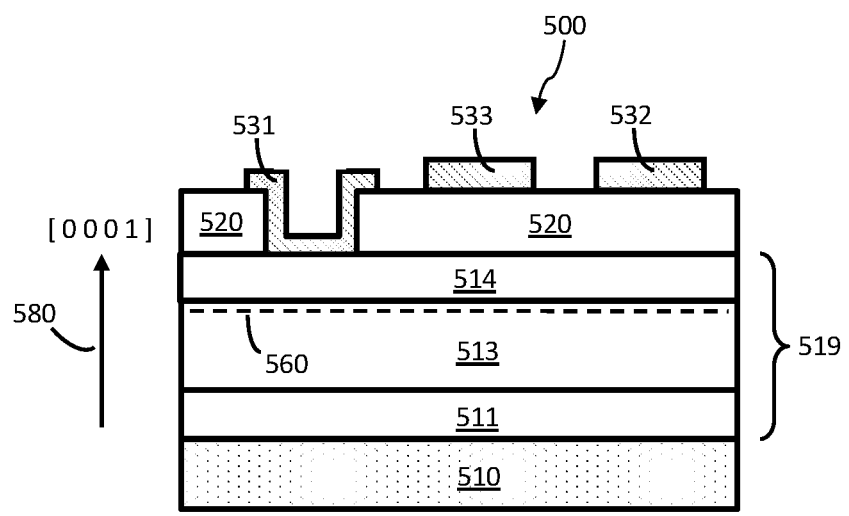
FIGS. 6A and 7-11 are schematic diagrams for example embodiments of semiconductor devices including a $Sc_xAl_{1-x}N$ layer formed over a III-N heterostructure.

FIG. 6A shows semiconductor device 500 that is an alternate example embodiment of semiconductor device 100. Semiconductor device 500 includes a material structure having a substrate 510 and a III-N material 519 over substrate 510. The III-N material 519 may comprise a heterostructure that includes a III-N barrier layer 514 having a first composition, a III-N channel layer 513 having a second composition different from the first composition, and a two-dimensional electron gas 560 in III-N channel layer 513. The compositional difference between III-N barrier layer 514 and III-N channel layer 513 causes two-dimensional electron gas (2DEG) 560 to be formed in III-N channel layer 513 adjacent to III-N barrier layer 514.

The III-N material 519 may further include a III-N buffer layer 511 formed on substrate 510, on top of which is formed III-N channel layer 513 and III-N barrier layer 514. The material structure may further include $Sc_xAl_{1-x}N$ layer 520 (0<x<1) over III-N material 519. As indicated by arrow 580, III-N material 519 may be formed in a III-polar (i.e., a [0 0 0 1]) orientation, such that $Sc_xAl_{1-x}N$ layer 520 is formed over the group-III face of III-N material 519. Semiconductor device 500 may further include a first electrode 531 coupled to III-N material 519 and a second electrode 532 on $Sc_xAl_{1-x}N$ layer 520.

The 2DEG 560 may be formed by fabricating III-N barrier layer 514 with a material having a wider bandgap than the material of III-N channel layer 513. Accordingly, III-N channel layer 513 may include or be formed of GaN, and III-N barrier layer 514 may include or be formed of $Al_yGa_{1-y}N$, where 0<v≤1. The thickness of III-N barrier layer 514 may, for example, be in a range of about 15 nm to 30 nm. In the embodiment of FIG. 6A, the conductive region within III-N material 519 of semiconductor device 500 is 2DEG 560 rather than an n-type layer 112 as in semiconductor device 100. Substrate 510 and III-N buffer layer 511 may be the same as those of semiconductor device 100.

The III-N material 519 may be the same as that used to form a III-N high electron mobility transistor (HEMT). An example III-N HEMT device includes a substrate, a III-N buffer layer, a III-N channel layer, a III-N barrier layer formed of a material having a wider bandgap than the material of the III-N channel layer, and a 2DEG that is formed in the III-N channel layer adjacent to the III-N barrier layer. The III-N HEMT device further includes a gate electrode formed over the III-N barrier layer, and source and drain electrodes, respectively, formed on opposite sides of the gate electrode. The source and drain electrodes may each be electrically connected to the 2DEG channel via an n-doped region, which may be formed via ion implantation or by selective area regrowth of n-type III-N material.

When the III-N material 519 is the same as that used to form the III-N HEMT device, a resonator or filter having the structure of semiconductor device 500 may be integrated on a single chip with the III-N HEMT device to which it is connected to as part of a circuit. The III-N material 519 may be epitaxially grown, for example by MOCVD or MBE, such that it is single-crystalline material. $Sc_xAl_{1-x}N$ layer 520 may also be epitaxially grown, for example by MOCVD or MBE, such that it forms a single-crystalline film. In order to prevent stress induced defects such as dislocations in $Sc_xAl_{1-x}N$ layer 520, the scandium composition x may be selected such that $Sc_xAl_{1-x}N$ layer 520 has the same or almost the same lattice constant as the underlying III-N channel layer 513. For example, x may be in a range of 0.05 to 0.4, 0.07 to 0.35, 0.9 to 0.3, or 0.1 to 0.25.

The first and second electrodes 531 and 532, respectively, may each comprise a metal or polycrystalline material. First electrode 531 may contact III-N material 519 and form an ohmic contact to 2DEG 560 according to an example embodiment of semiconductor device 500. Alternatively, first electrode 531 may contact III-N material 519 and form a Schottky contact to III-N material 519. A thin insulating material may alternatively be inserted between first electrode 531 and underlying III-N material 519, such that first electrode 531 forms a metal oxide semiconductor (MOS) contact that is coupled to 2DEG 560. First electrode 531 may be at least partially in an aperture formed in $Sc_xAl_{1-x}N$ layer 520. Semiconductor device 500 alternatively includes a third electrode 533 formed of a suitable metal or polycrystalline material that is also on $Sc_xAl_{1-x}N$ layer 520.

Figure 6B:
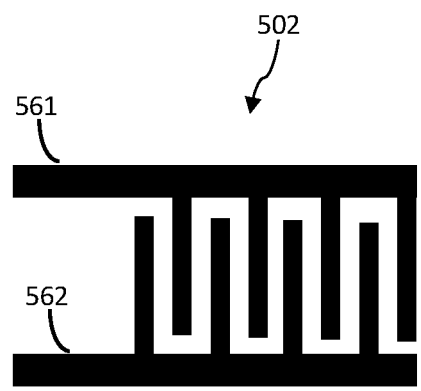
FIG. 6B is a schematic diagram of an interdigital transducer used in the semiconductor device of FIG. 6A.

In an example embodiment of semiconductor device 500, second and third electrodes 532 and 533 may each be formed as or be a part of an IDT 502 shown in FIG. 6B. In this embodiment, electrodes 532 and 533 each include two interdigital electrodes 561 and 562.

$Sc_xAl_{1-x}N$ layer 520 along with electrodes 532 and 533 may form a SAW device. For example, electrodes 532 and 533 may each be IDTs, and an input RF signal at one of the electrodes may generate an acoustic wave that travels along the surface of $Sc_xAl_{1-x}N$ layer 520, thereby causing a transmitted electromagnetic wave that corresponds to the transmitted acoustic wave to be received at the other electrode.

Figure 7:
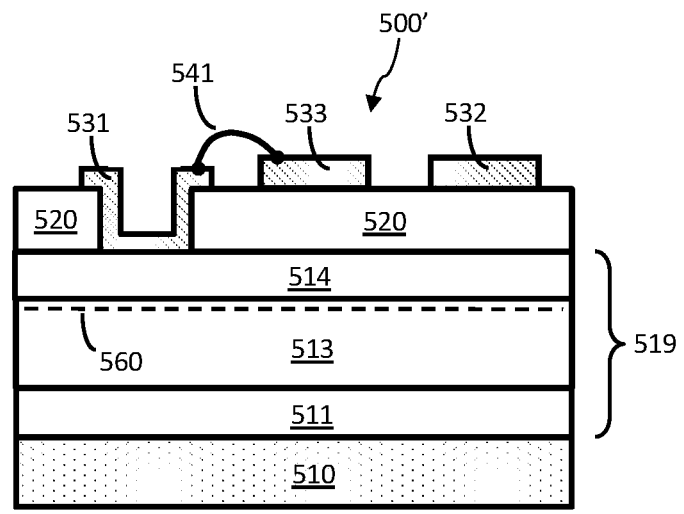

FIG. 7 is an illustration of a semiconductor device 500' that is an example embodiment of semiconductor device 500 in which third electrode 533 is electrically connected to first electrode 531, for example via bond wire 541. Wire bond 541 may comprise a material which is sufficiently conductive to ensure that the electric potential at each of electrodes 531 and 533 is the same or about the same at all times under any bias conditions. This configuration may allow electromagnetic waves transmitted through 2DEG 560 to pass through first electrode 531 to third electrode 533 and serve as the input to the SAW device made up of $Sc_xAl_{1-x}N$ layer 520 together with second and third electrodes 532 and 533, respectively. Alternatively, an RF signal that is input at second electrode 532 and output at third electrode 533 may be transmitted into 2DEG 560 through first electrode 531. Accordingly, in this configuration the first electrode 531 may form an ohmic contact to 2DEG 560.

Figure 8:
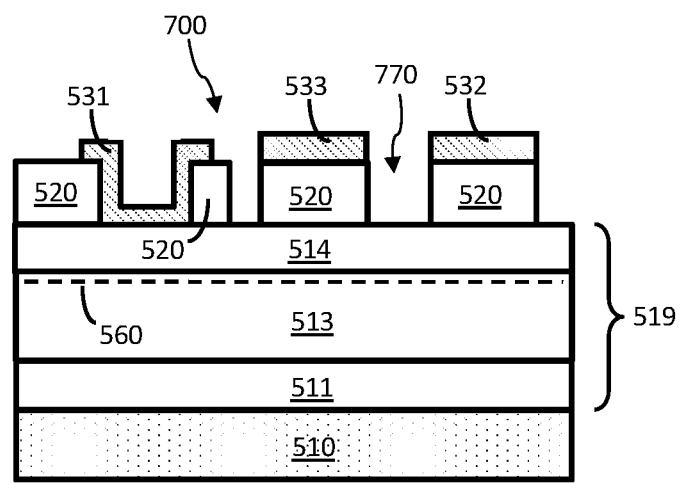

FIG. 8 is an illustration of a semiconductor device 700 that is an example embodiment of semiconductor device 500 in which $Sc_xAl_{1-x}N$ layer 520 further includes a recess 770 formed therein between second and third electrodes 532 and 533, respectively. Recess 770 may extend through the entire thickness of $Sc_xAl_{1-x}N$ layer 520, thereby defining a plurality of $Sc_xAl_{1-x}N$ mesas each having one or more electrodes formed thereon.

Semiconductor device 700 may be operated as a multi-mode BAW device. For example, a signal may be input at third electrode 533, generating a bulk acoustic wave that propagates through underlying $Sc_xAl_{1-x}N$ layer 520 into III-N material 519 and then back up through $Sc_xAl_{1-x}N$ layer 520 beneath second electrode 532, after which it is output through second electrode 532. Similarly, a signal input at second electrode 532 may generate a bulk acoustic wave that generates an output signal at third electrode 533. Alternatively, if first electrode 531 forms an ohmic contact to 2DEG 560, an input signal at either second electrode 532 or third electrode 533 may create a bulk acoustic wave passing through the underlying $Sc_xAl_{1-x}N$ layer 520 to III-N material 519, creating an electromagnetic wave that induces a current in 2DEG 560 such that the signal is output at first electrode 531. Alternatively, semiconductor device 700 may include additional $Sc_xAl_{1-x}N$ mesas with overlying electrodes. As such, depending on the mode of operation of this semiconductor device embodiment, different resonant modes may be applied to an input signal by the $Sc_xAl_{1-x}N$ based filter.

The BAW device in FIG. 8 may be connected to another semiconductor device such as the III-N HEMT device via 2DEG 560. That is, one of the $Sc_xAl_{1-x}N$ mesas may be the bulk material of a filter, the overlying electrode (second electrode 532 or third electrode 532) may be an input or output electrode respectively, and 2DEG 560 may effectively act as a backside electrode. Accordingly, rather than connect another electrode to 2DEG 560 and connect this electrode to an electrode of the III-N HEMT device, the electrode of the III-N HEMT device may be connected directly to 2DEG 560. In this mode of operation, the first electrode 531 may be operated to electrically connect or disconnect the $Sc_xAl_{1-x}N$ based filter to or from the III-N HEMT device during circuit operation. Such electrical switching may be achieved by implementing first electrode 531 as a Schottky contact and applying appropriate biases to first electrode 531 to deplete or enhance the charge in 2DEG 560 directly beneath first electrode 531. For example, if a sufficiently negative voltage or potential is applied to first electrode 531 (relative to the potential at 2DEG 560), 2DEG 560 may be fully depleted below first electrode 531, thereby electrically isolating the BAW device configured in semiconductor device 700 from any other semiconductor device connected to 2DEG 560 on the opposite side of first electrode 531. A sufficiently positive voltage applied to first electrode 531 (relative to the potential at 2DEG 560) causes underlying 2DEG 560 to be enhanced or at least to remain continuous, such that any other semiconductor device connected to 2DEG 560 on the opposite side of first electrode 531 from the BAW device in semiconductor device 700 would remain connected to the BAW device.

Figure 9:
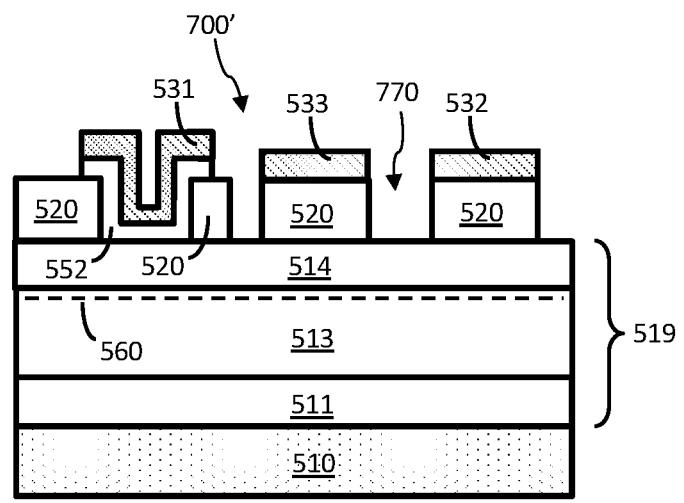

FIG. 9 shows a semiconductor device 700' that is an example embodiment of semiconductor device 700 in which first electrode 531 is implemented as a MOS contact, such that an insulating material 552 (e.g., SiN) is included between first electrode 531 and III-N material 519. Implementing first electrode 531 as a MOS device may allow it to deplete or enhance 2DEG 560 directly beneath first electrode 531 to achieve the electrical switching described above.

The material structures in any of the example embodiments for semiconductor devices 500, 500', 700, and 700' may further include an additional III-N layer between III-N material 519 and $Sc_xAl_{1-x}N$ layer 520. The additional III-N layer may be an n-type III-N layer. In semiconductor devices that include a recess formed in $Sc_xAl_{1-x}N$ layer 520 (e.g., recess 770 in semiconductor device 700 or 700'), the recess may extend at least partially through the additional III-N layer.

Figure 10:
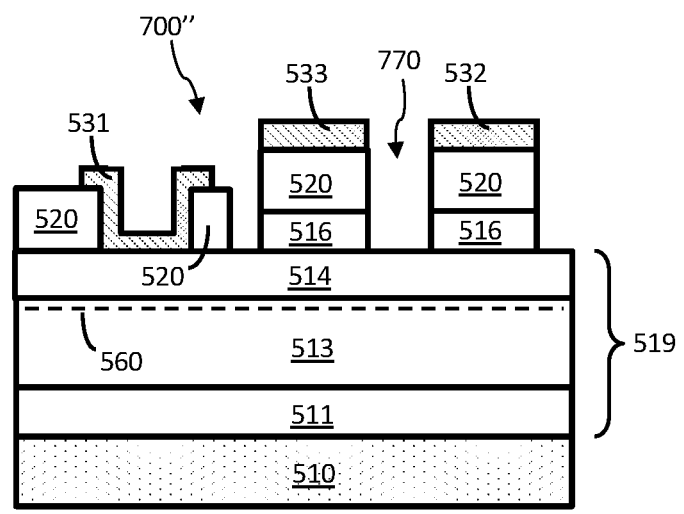

FIG. 10 illustrates a semiconductor device 700" that is an example embodiment of semiconductor device 700 with an additional III-N layer 516 between at least a portion of $Sc_xAl_{1-x}N$ layer 520 and III-N material 519. III-N layer 516 may be an n-type III-N layer such as an n$^+$ GaN layer. Semiconductor device 700" also includes recess 770 between second electrode 532 and third electrode 533. Recess 770 may extend through the entire thickness of $Sc_xAl_{1-x}N$ layer 520, and may also extend through the entire thickness of the additional III-N layer 516.

Figure 11:
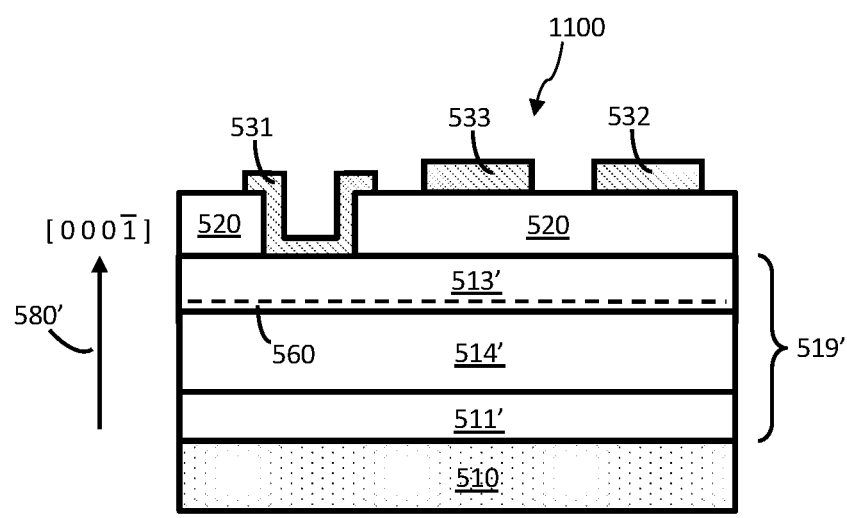

FIG. 11 illustrates a semiconductor device 1100 that is an example embodiment of semiconductor device 500 in which III-N material 519' is formed in an N-polar (e.g., a [0 0 0 1bar]) orientation, as indicated by arrow 580', with $Sc_xAl_{1-x}N$ layer 520 formed over the N-face of III-N material 519'. The compositional difference between III-N barrier layer 514' and III-N channel layer 513' causes 2DEG 560 to be formed in III-N channel layer 513' adjacent to III-N barrier layer

514'. The 2DEG 560 may be formed in III-N channel layer 513' by fabricating III-N barrier layer 514' having a material with a wider bandgap than the material of III-N channel layer 513'. Accordingly, III-N channel layer 513' may include or be formed of N-polar GaN, and III-N barrier layer 514' may include or be formed of N-polar $Al_vGa_{1-v}N$, where $0<v\leq1$.

Figure 12:
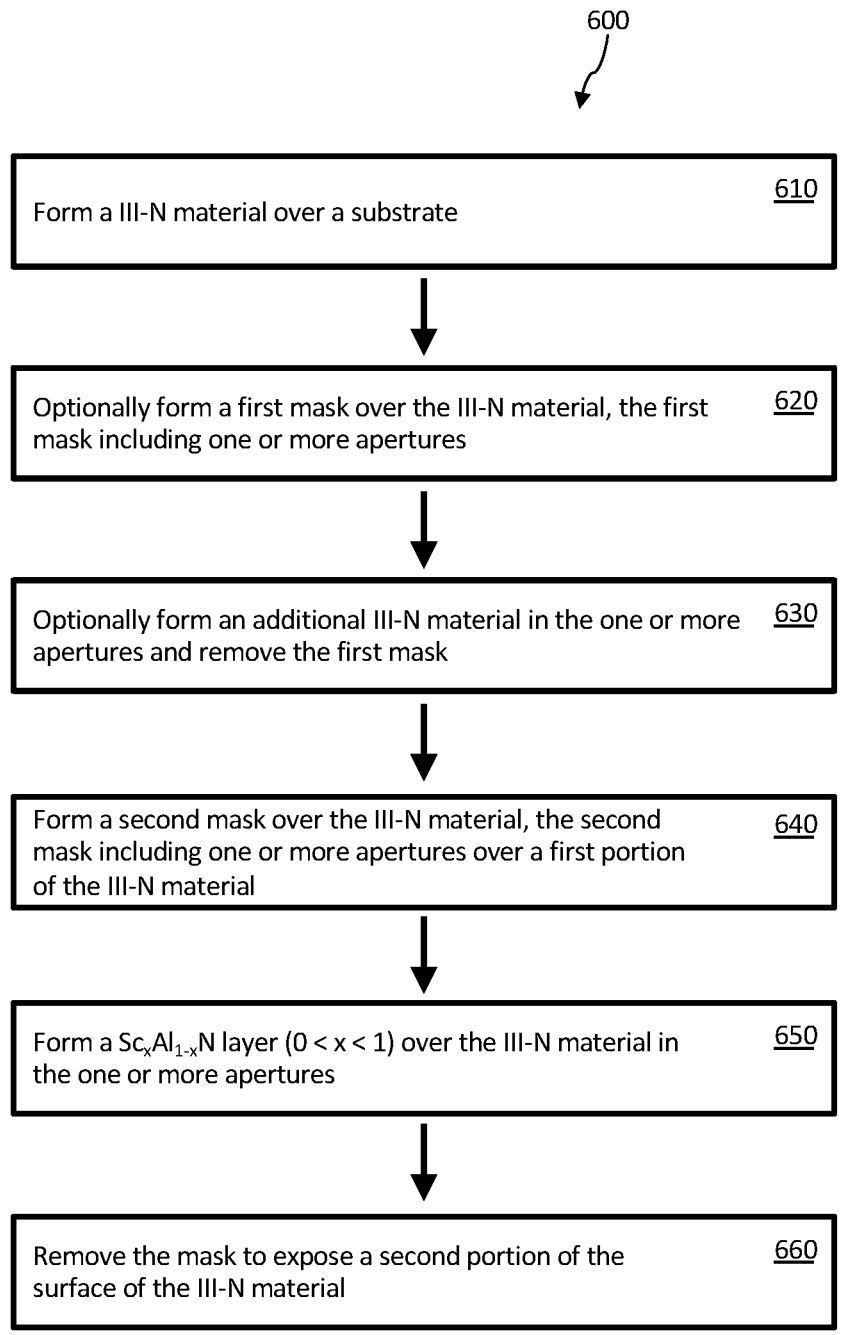
FIGS. 12 and 13A-13I illustrate an example method for forming the semiconductor device of FIG. 10.
Figure 13A:
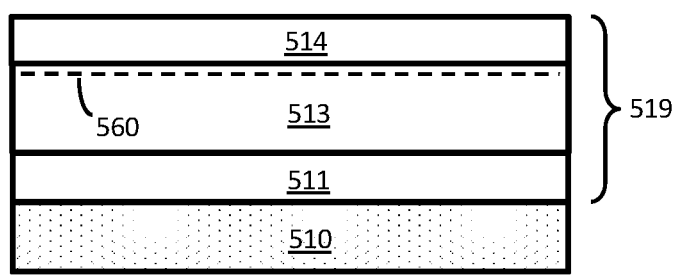
Figure 13B:
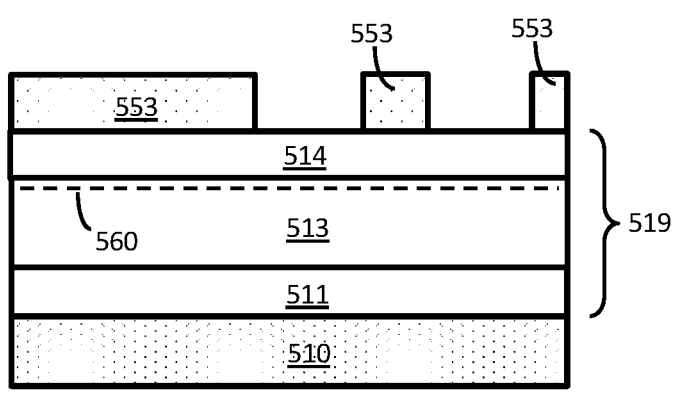
Figure 13C:
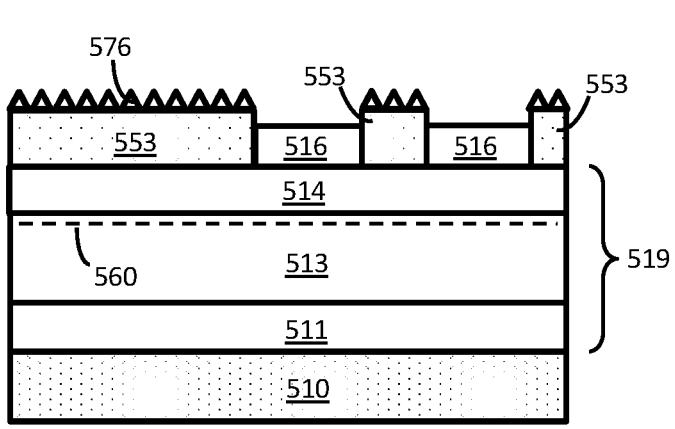
Figure 13D:
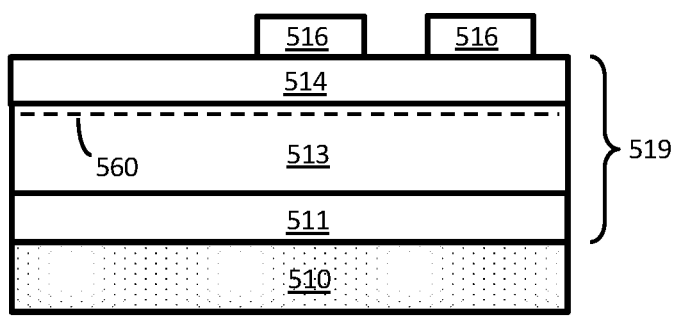
Figure 13E:
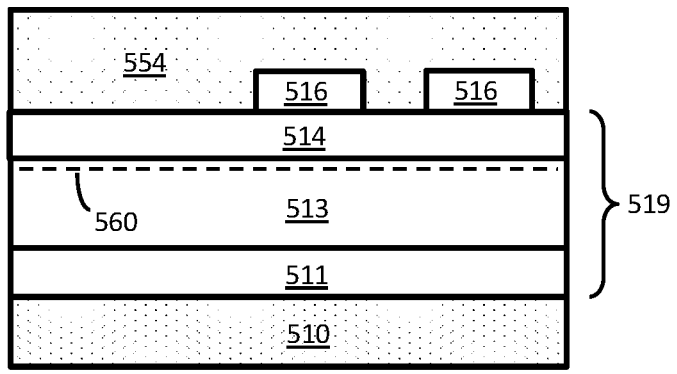
Figure 13F:
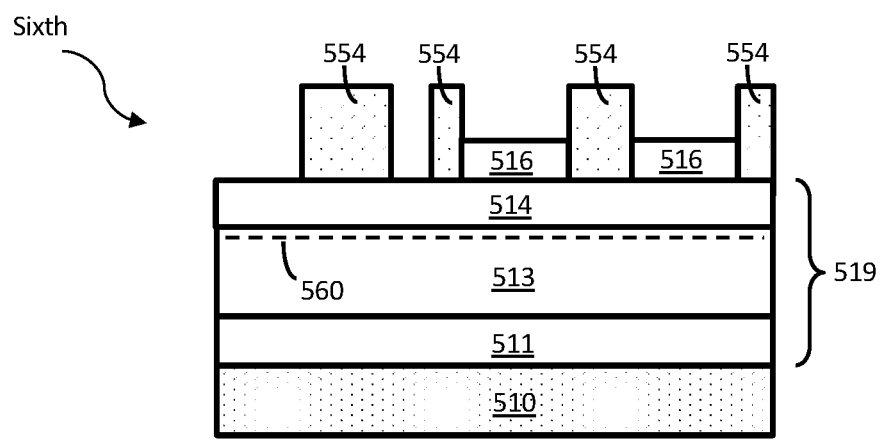
Figure 13G:
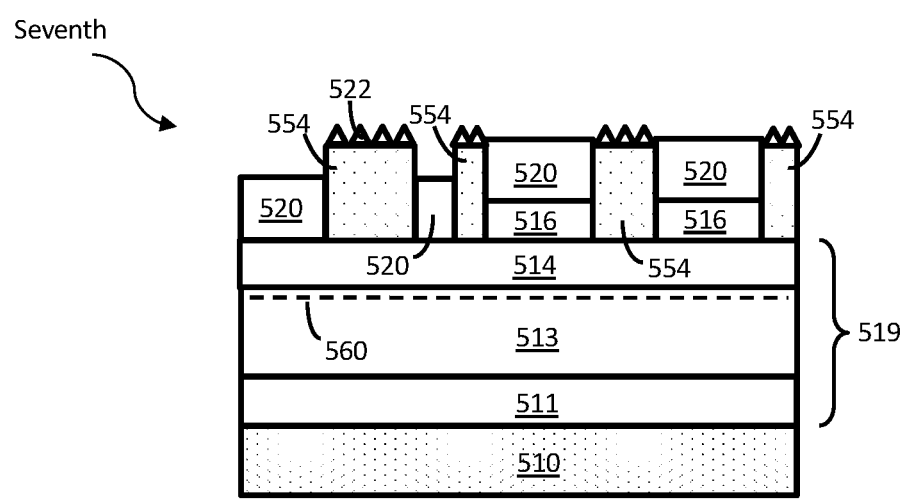
Figure 13H:
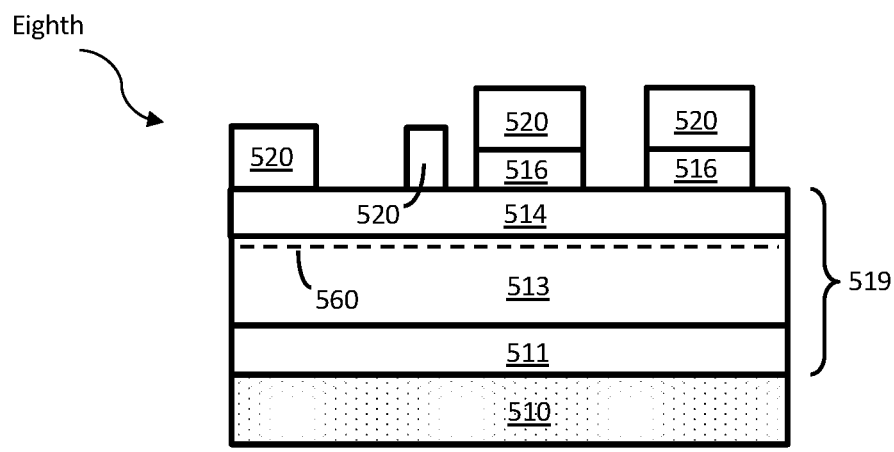
Figure 13I:
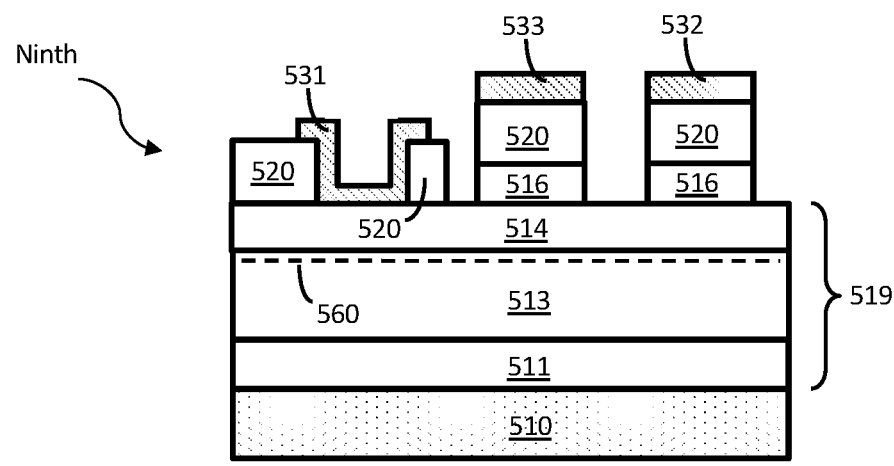

FIG. 12 illustrates an example method 600 for forming semiconductor device 700". Method 600 includes forming (step 610) a III-N material 519 over a substrate 510, optionally forming (step 620) a first mask 533 over the III-N material 519, the first mask including one or more apertures, optionally forming (step 630) an additional III-N material 516 in the one or more apertures, forming (step 640) a second mask 554 over III-N material 519, mask 554 including one or more apertures over a first portion of a surface of III-N material 519, forming (step 650) a $Sc_xAl_{1-x}N$ layer 520 over III-N material 519 in the one or more apertures, and removing (step 660) mask 554 to expose a second portion of the surface of III-N material 519.

FIGS. 13A-13I show an example embodiment of method 600 for forming semiconductor device 700". First (FIG. 13A), III-N buffer layer 511, III-N channel layer 513, and III-N barrier layer 514 of III-N material 519 are grown on substrate 510 by an epitaxial technique such as MBE or MOCVD. Second (FIG. 13B), a first mask layer 553, which may for example be $SiO_2$, is deposited and patterned over III-N material 519 such that first mask layer 553 includes one or more apertures. Third (FIG. 13C), first mask layer 553 is used as a regrowth mask to selectively grow additional III-N layer 516 in the unmasked regions above III-N layer 519. The selective area regrowth may, for example, be performed using an epitaxial growth technique such as MBE or MOCVD. This regrowth step may cause polycrystalline III-N material 576 to form over first mask layer 553.

Fourth (FIG. 13D), first mask layer 553 and any overlying polycrystalline material 576 are removed, for example by etching. Fifth (FIG. 13E), a second mask layer 554 (e.g., $SiO_2$) is deposited over the III-N materials. Sixth (FIG. 13F), second mask layer 554 is patterned to form a regrowth mask for selective area growth of $Sc_xAl_{1-x}N$ layer 520. Patterning of second mask layer 554 may include forming one or more apertures in the mask over a first portion of a surface of the underlying III-N materials. Seventh (FIG. 13G), $Sc_xAl_{1-x}N$ layer 520 is selectively grown at least in the unmasked regions (i.e., in the apertures in mask layer 554) above the III-N materials. The selective area growth may, for example, be performed using an epitaxial growth technique such as MBE or MOCVD. This regrowth step may cause polycrystalline $Sc_xAl_{1-x}N$ 522 to form over second mask layer 554. Eighth (FIG. 13H), second mask layer 554 and any overlying polycrystalline material 522 are removed, for example by etching, to expose a second portion of III-N material 519. Ninth (FIG. 13I), electrodes 531, 532, and 533 are deposited, thereby forming semiconductor device 700". This method (FIGS. 13A-13I) may also be configured to form material structure of semiconductor devices 500, 500', 700, 700', and 1100.

Figure 14:
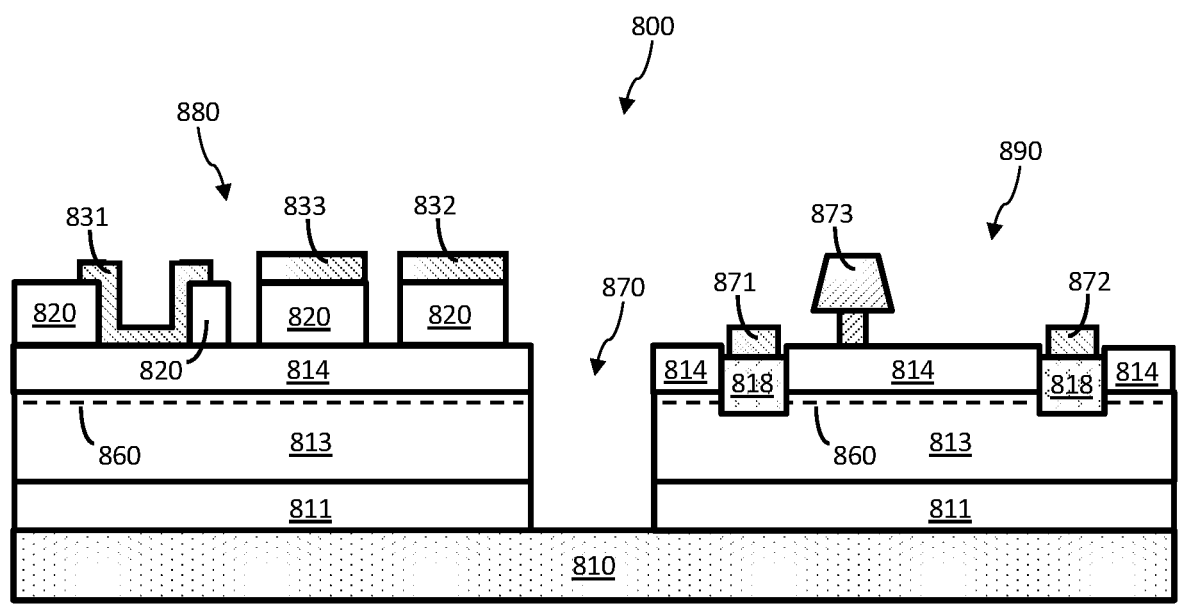
FIG. 14 is a schematic diagram for an example embodiment of a semiconductor device which includes a first device having a $Sc_xAl_{1-x}N$ layer over a III-N material and a second device having source and drain electrodes that electrically contact a 2DEG and a gate electrode between the source and drain electrodes.

FIG. 14 illustrates a semiconductor device 800 according to an example embodiment which includes a substrate 810 and a III-N material 813, 814 over a common substrate 810. III-N material 813, 814 may include a III-N barrier layer 814 having a first composition and a III-N channel layer 813 having a second composition that is different from the first composition. Semiconductor device 800 further includes a 2DEG 860 in III-N channel layer 813. A compositional difference between III-N barrier layer 814 and III-N channel layer 813 causes 2DEG 860 to be formed in III-N channel layer 813. III-N material 813, 814 includes a first region that is part of a first device 880 and a second region that is part of a second device 890, wherein a recess 870 is formed in III-N material 813, 814 between the first and second regions. Recess 870 extends through 2DEG 860. First device 880 further includes a $Sc_xAl_{1-x}N$ layer 820 ($0<x<1$) over a portion of the first region of III-N material 813, 814. Second device 890 includes source and drain electrodes 871 and 872, respectively, that electrically contact 2DEG 860, and a gate electrode 873 between the source and drain electrodes 871 and 872.

First device 880 is monolithically integrated with second device 890 on common substrate 810. First device 880 may include a $Sc_xAl_{1-x}N$ based filter or resonator, and second device 890 is a III-N transistor (e.g., the III-N HEMT device). Common substrate 810 may be any substrate suitable for the epitaxial growth of III-N materials, and may for example be silicon carbide (SiC), silicon (Si), gallium nitride (GaN), Aluminum Nitride (AlN), or sapphire. The III-N material 813, 814 may further include a III-N buffer layer 811 between common substrate 810 and III-N material 813, 814. A compositional difference between III-N barrier layer 814 and III-N channel layer 813 causes 2DEG 860 to be formed in III-N channel layer 813 adjacent to III-N barrier layer 814. For example, 2DEG 860 may be formed by fabricating III-N barrier layer 814 with a material having a wider bandgap than the material of III-N channel layer 813. Accordingly, III-N channel layer 813 may include or be formed of GaN, and III-N barrier layer 814 may include or be formed of $Al_vGa_{1-v}N$, where $0<v\leq1$. The thickness of III-N barrier layer 814 may, for example, be in a range of about 15 nm to 30 nm.

Recess 870 is formed in III-N material 813, 814 to define a first region of III-N material 813, 814 on one side of recess 870 and a second region of III-N material 813, 814 on an opposite side of recess 870. The first region of III-N material 813, 814 is part of first device 880, and the second region of III-N material 813, 814 is part of second device 890. Recess 870 may extend through 2DEG 860, and may further extend through the entire thickness of III-N material 813, 814 to common substrate 810.

First device 880 further includes a $Sc_xAl_{1-x}N$ layer ($0<x<1$) 820 over a portion of the first region of III-N material 813, 814. First device 880 also includes a first electrode 831 that is coupled to III-N material 813, 814, a second electrode 832 on $Sc_xAl_{1-x}N$ layer 820, and optionally a third electrode 833 on $Sc_xAl_{1-x}N$ layer 820. First device 880 may be an embodiment of semiconductor device 700 in which $Sc_xAl_{1-x}N$ layer 820 may be formed as a plurality of $Sc_xAl_{1-x}N$ mesas, with each mesa having at least one electrode formed thereon. Alternatively, first device 880 may be an embodiment of the material structure shown in any of semiconductor devices 100, 100', 300, 500, 500', 700', and 700". Accordingly, first electrode 831 may form an ohmic contact to 2DEG 860. Alternatively, first electrode 831 may form a Schottky contact to III-N material 813, 814. First device 880 may be an embodiment of semiconductor device 700' in which first electrode 831 is formed as an MOS contact, and may thereby include an insulating material between first electrode 831 and underlying III-N material 813, 814.

Second device 890 includes n-type regions 818, and source and drain electrodes 871 and 872. Source and drains 871 and 872, respectively, are formed on n-type regions 818, such that they are electrically connected to (e.g., electrically contact) 2DEG 860. A gate electrode 873, formed between source and drain electrodes 871 and 872, modulates the charge in underlying 2DEG 860, thereby turning second device 890 (e.g., transistor) on or off during device operation.

Figure 15:
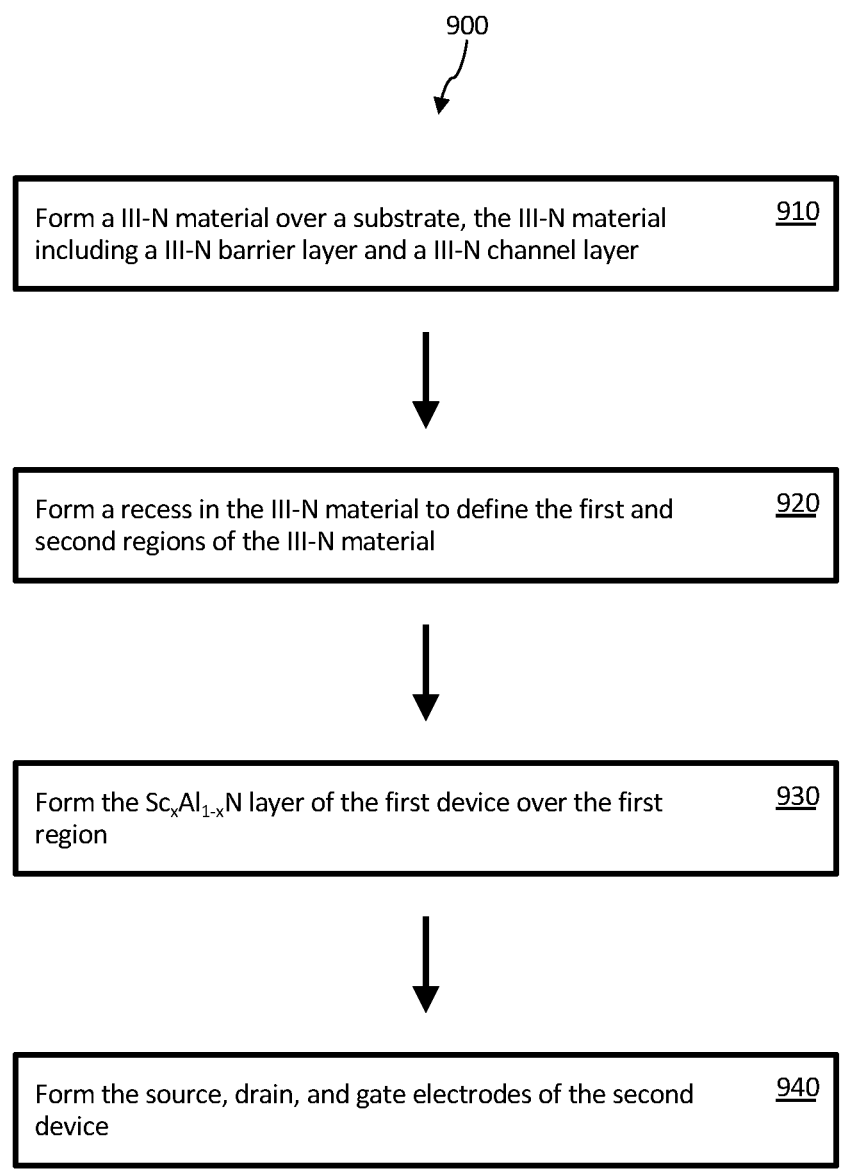
FIGS. 15 and 16A-16J illustrate an example method for forming the semiconductor device of FIG. 14.
Figure 16A:
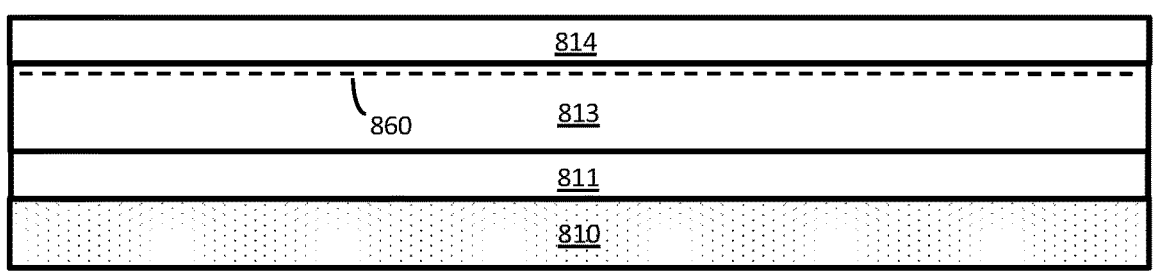
Figure 16B:
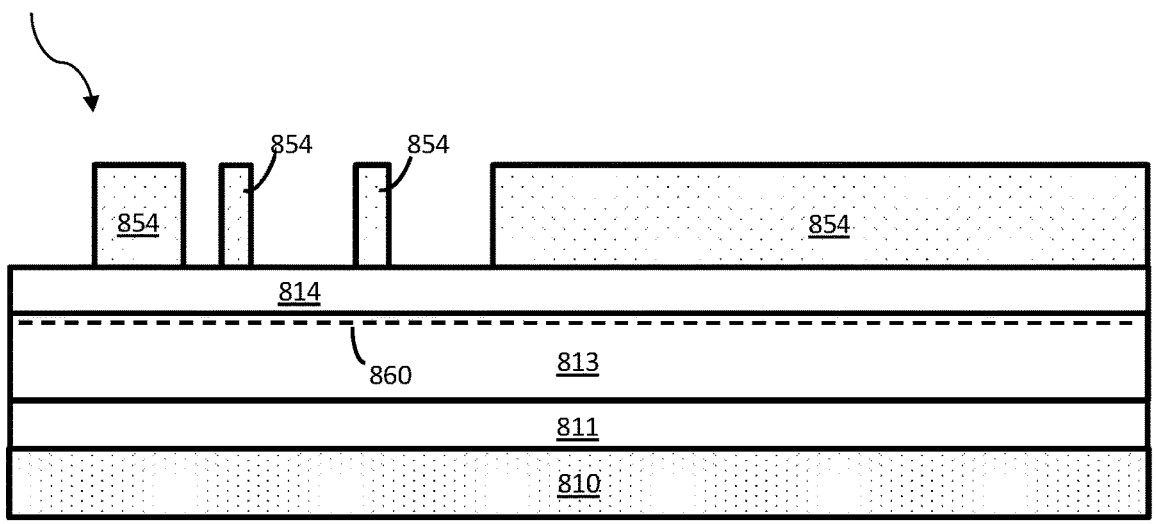
Figure 16C:
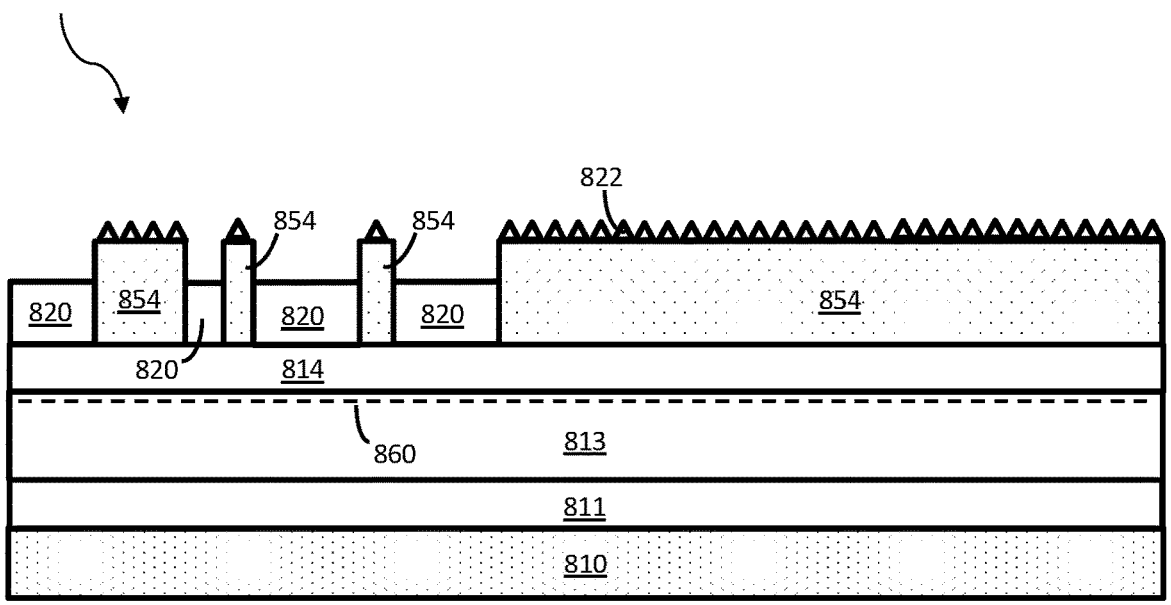
Figure 16D:
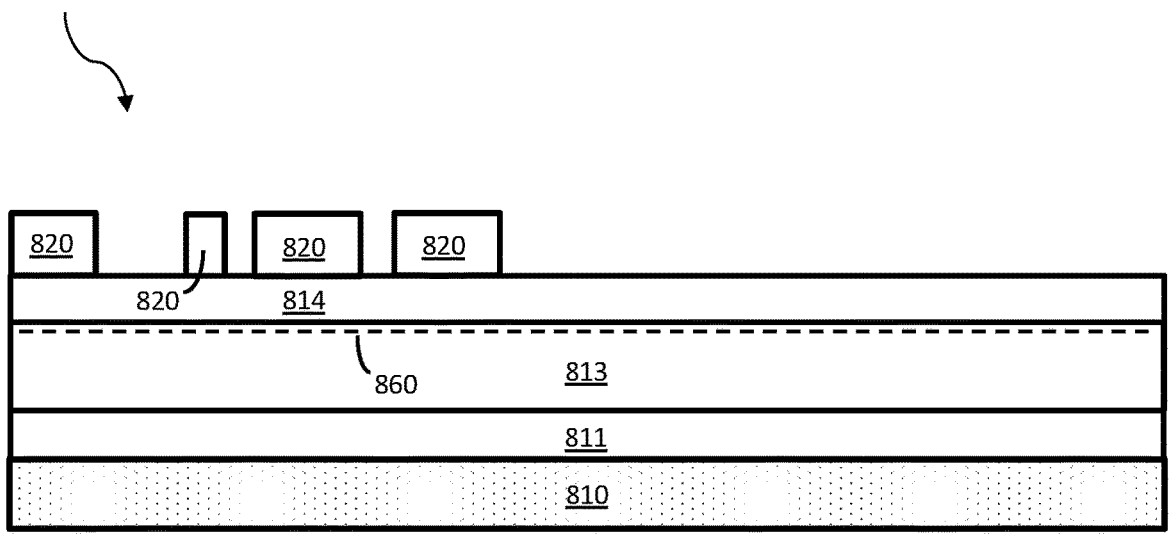
Figure 16E:
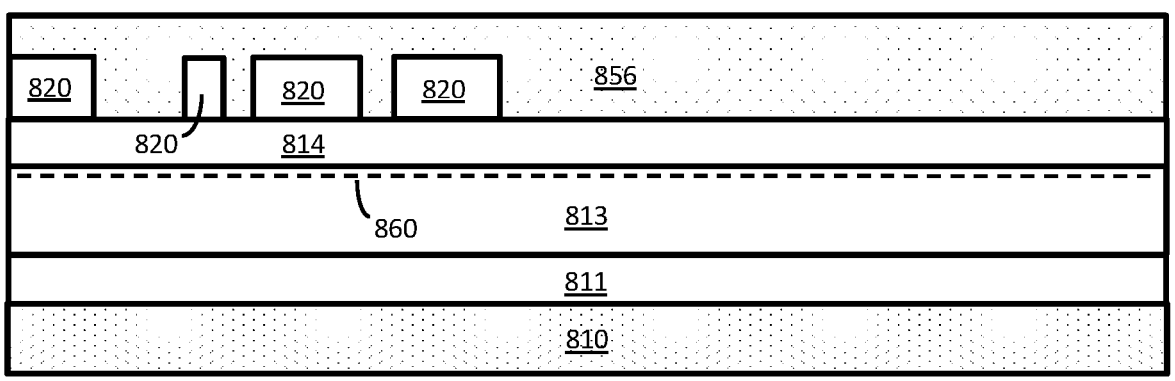
Figure 16F:
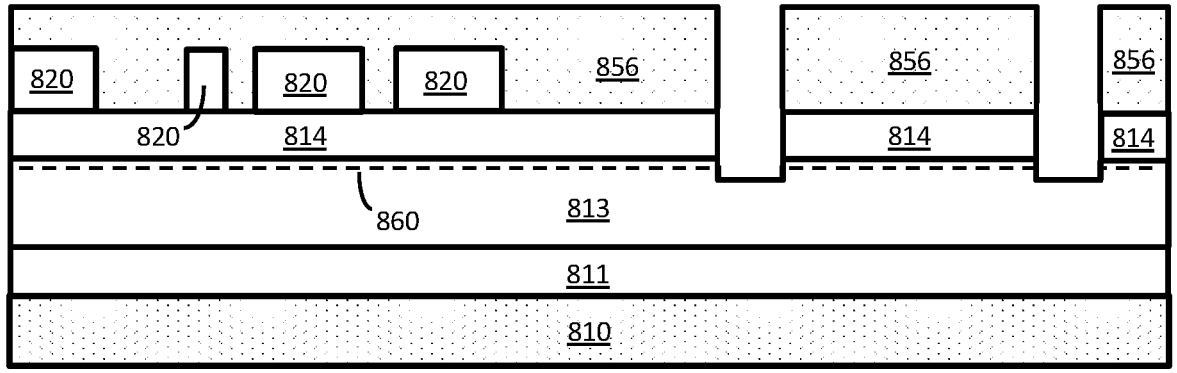
Figure 16G:
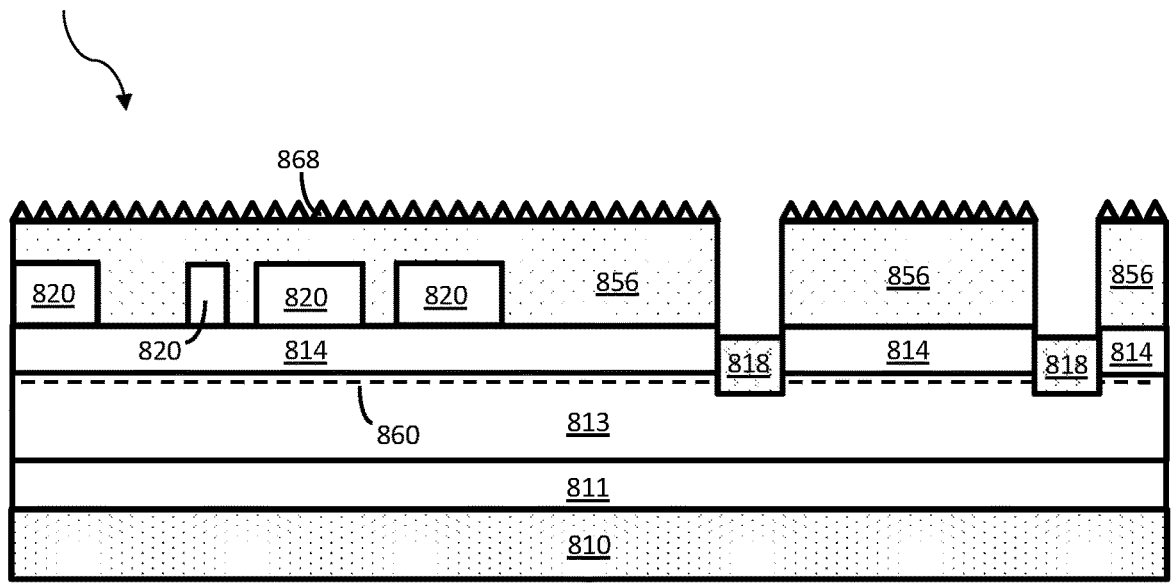
Figure 16H:
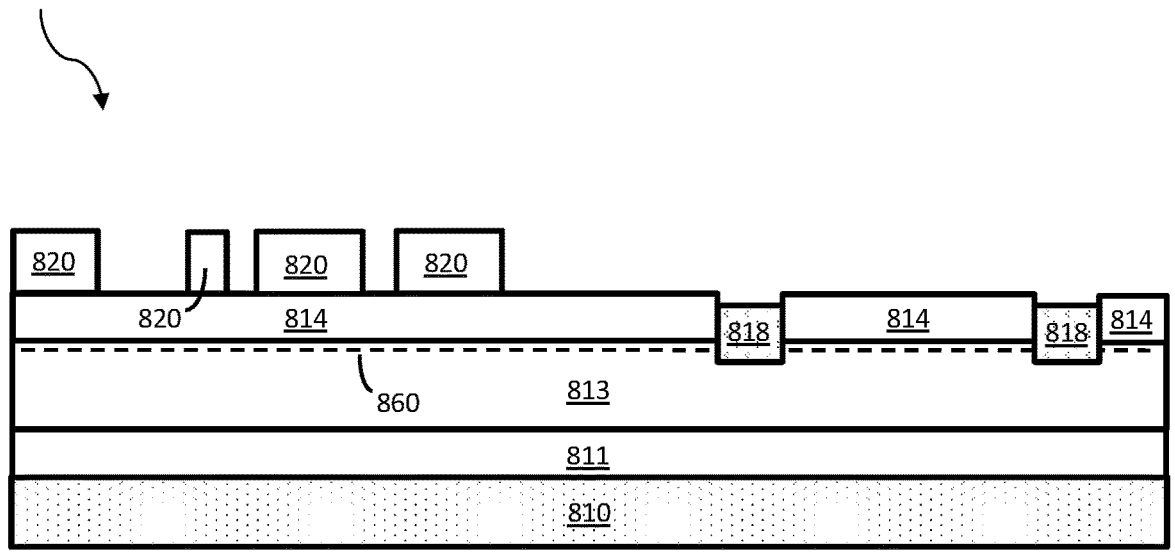
Figure 16I:
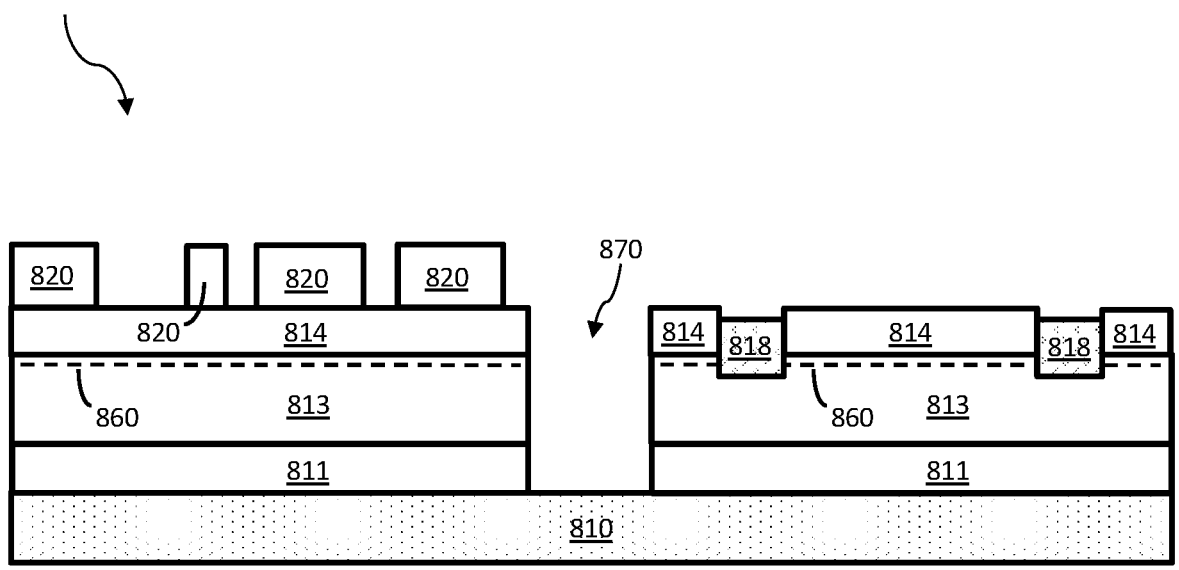
Figure 16J:
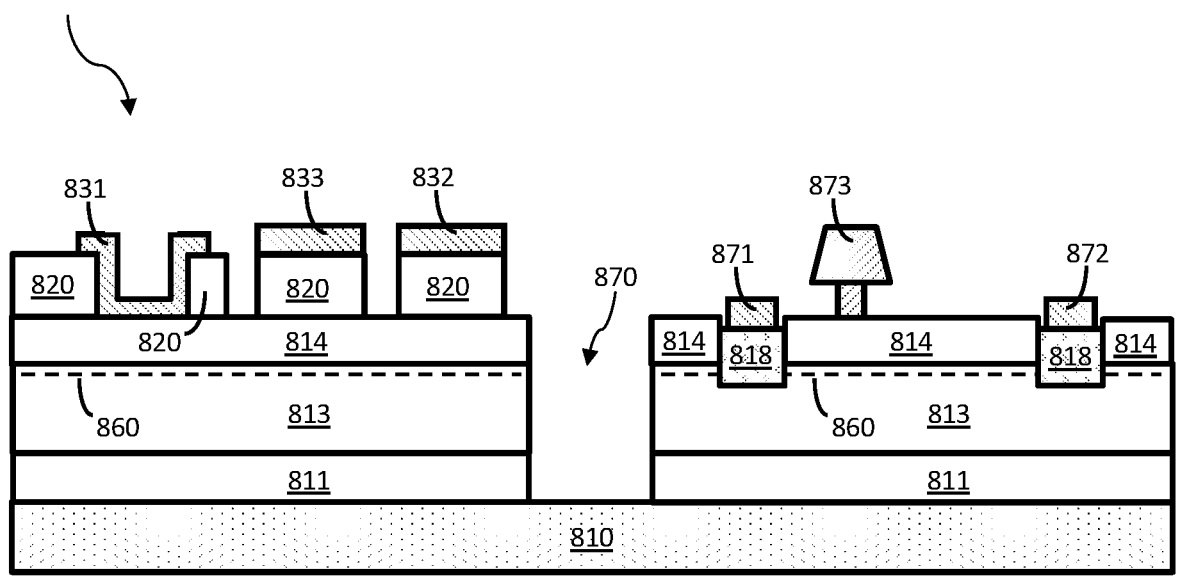

FIG. 15 illustrates an example method 900 for forming semiconductor device 800. Method 900 includes forming (step 910) a III-N material 813, 814 over a common substrate 810, III-N material 813, 814 including III-N barrier layer 814 and III-N channel layer 813. A compositional difference between III-N barrier layer 814 and III-N channel layer 813 causes 2DEG 860 to be formed in III-N channel layer 813. Method 900 further includes forming (step 920) a recess 870 in III-N material 813, 814 to define a first region of III-N material 813, 814 that is part of a first device 880 and a second region of III-N material 813, 814 that is part of a second device 890. Method 900 also includes forming (step 930) a $Sc_xAl_{1-x}N$ layer 820 (0<x<1) over a portion of the first region of III-N material 813, 814, wherein $Sc_xAl_{1-x}N$ layer 820 is part of first device 880. $Sc_xAl_{1-x}N$ layer 820 can either be formed before or after formation of the recess 870. Furthermore, method 900 includes forming (step 940) a source electrode 871, a drain electrode 872, and a gate electrode 873. Source and drain electrodes 871 and 872 electrically contact 2DEG 860 in the second region of III-N material 813, 814, and gate electrode 873 is between source and drain electrodes 871 and 872. Source, gate, and drain electrodes 871, 872, and 873 are each part of second device 890.

FIGS. 16A-16J show an example embodiment of method 900 for forming semiconductor device 800. First (FIG. 16A), III-N buffer layer 811, III-N channel layer 813, and III-N barrier layer 814 are sequentially grown on common substrate 810 by an epitaxial technique such as MBE or MOCVD. Second (FIG. 16B), first mask layer 854, which may for example be $SiO_2$, is deposited and patterned over III-N material 813, 814 such that first mask layer 854 includes one or more apertures over the region in which first device 880 is formed. Third (FIG. 16C), $Sc_xAl_{1-x}N$ layer 820 is selectively grown at least in the unmasked regions (i.e., in the apertures in mask layer 854) above III-N materials 813, 814. The selective area growth may, for example, be performed using an epitaxial growth technique such as MBE or MOCVD. This regrowth step may cause polycrystalline $Sc_xAl_{1-x}N$ 822 to form over second mask layer 854. Fourth (FIG. 16D), first mask layer 854 and any overlying polycrystalline material 822 are removed, for example by etching, to expose a second portion of III-N material 813, 814.

Fifth (FIG. 16E), second mask layer 856, which may for example be $SiO_2$, is deposited over the entire semiconductor device 800. Sixth (FIG. 16F), second mask layer 856 is patterned to form apertures in the source and drain regions of second device 890, and III-N material 813, 814 beneath the apertures is etched at least through 2DEG 860. Seventh (FIG. 16G), n-type III-N material 818 (e.g., GaN) is selectively grown in the apertures in second mask layer 856. The selective area regrowth may, for example, be performed using an epitaxial growth technique such as MBE or MOCVD. This regrowth step may cause polycrystalline III-N material 868 to form over second mask layer 856. Eighth (FIG. 16H), second mask layer 856 and any overlying polycrystalline material 868 are removed, for example by etching. Ninth (FIG. 16I), recess 870 is formed in III-N material 813, 814 to define the first region of III-N material 813, 814 that is part of first device 880 and the second region of III-N material 813, 814 that is part of second device 890. Tenth (FIG. 16J), first, second, and third electrodes 831, 832, and 833 respectively are formed on first device 880, and source electrode 871, drain electrode 872, and gate electrode 873 of second device 890 are formed in the resulting semiconductor device 800.

A number of example embodiments have been described. Nevertheless, it will be understood that various modifications may be made without departing from the spirit and scope of the devices and methods described herein.

What is claimed is:

1. A semiconductor device, comprising:
  a substrate;
  an n-type III-N layer over the substrate, wherein an entirety of the n-type III-N layer has an n-type donor concentration greater than $10^{18}$ cm$^{-3}$;
  a $Sc_xAl_{1-x}N$ layer over the n-type III-N layer, wherein 0<x<1;
  a first electrode contacting the n-type III-N layer; and
  a second electrode on the $Sc_xAl_{1-x}N$ layer;
  wherein:
  the $Sc_xAl_{1-x}N$ layer comprises an aperture; and
  the first electrode is disposed at least partially in the aperture and forms an ohmic contact to the n-type III-N layer.

2. The semiconductor device of claim 1, further comprising a third electrode on the $Sc_xAl_{1-x}N$ layer.

3. The semiconductor device of claim 2, wherein the third electrode is electrically connected to the first electrode.

4. The semiconductor device of claim 2, wherein the $Sc_xAl_{1-x}N$ layer comprises a recess between the second and third electrodes.

5. The semiconductor device of claim 2, wherein the second and third electrodes are part of an interdigital transducer.

6. The semiconductor device of claim 2, wherein the $Sc_xAl_{1-x}N$ layer, the second electrode, and the third electrode are part of a surface acoustic wave device.

7. A method of forming a semiconductor device, comprising:
  forming an n-type III-N layer over a substrate, wherein an entirety of the n-type III-N layer has an n-type donor concentration greater than $10^{18}$ cm$^{-3}$;
  forming a $Sc_xAl_{1-x}N$ layer over the n-type III-N layer, wherein 0<x<1;
  forming a mask over the $Sc_xAl_{1-x}N$ layer, the mask including an opening over a first portion of the $Sc_xAl_{1-x}N$ layer;
  removing the first portion of the $Sc_xAl_{1-x}N$ layer to form an aperture in the $Sc_xAl_{1-x}N$ layer;
  depositing a first electrode at least partially in the aperture, wherein the first electrode forms an ohmic contact to the n-type III-N layer; and
  forming a second electrode on the $Sc_xAl_{1-x}N$ layer.

8. The method of claim 7, further comprising forming a third electrode on the $Sc_xAl_{1-x}N$ layer.

9. The method of claim 8, wherein the $Sc_xAl_{1-x}N$ layer, the second electrode, and the third electrode are part of a surface acoustic wave device.

10. A semiconductor device, comprising:
  a substrate;
  an n-type III-N layer over the substrate, wherein an entirety of the n-type III-N layer has an n-type donor concentration greater than $10^{18}$ cm$^{-3}$;
  a $Sc_xAl_{1-x}N$ layer over the n-type III-N layer, wherein 0<x<1;
  a first electrode contacting the n-type III-N layer; and
  a second electrode and a third electrode, wherein the second and the third electrodes are on the $Sc_xAl_{1-x}N$ layer;
  wherein the $Sc_xAl_{1-x}N$ layer comprises an aperture, and the first electrode is disposed at least partially in the aperture; and the third electrode is electrically connected to the first electrode, such that the electric potential at the first and third electrodes is the same or about the same at all times under any bias conditions.

11. The semiconductor device of claim 10, wherein the $Sc_xAl_{1-x}N$ layer comprises a recess between the second and third electrodes.

12. The semiconductor device of claim 10, wherein the second and third electrodes are part of an interdigital transducer.

13. The semiconductor device of claim 10, wherein the $Sc_xAl_{1-x}N$ layer, the second electrode, and the third electrode are part of a surface acoustic wave device.

14. A semiconductor device, comprising:
a substrate;
an n-type III-N layer over the substrate, wherein an entirety of the n-type III-N layer has an n-type donor concentration greater than $10^{18}$ cm$^{-3}$;
a $Sc_xAl_{1-x}N$ layer over the n-type III-N layer, wherein 0<x<1, and wherein the $Sc_xAl_{1-x}N$ layer comprises a first side contacting the n-type III-N layer and a second side opposite the first side;
a first electrode contacting the n-type III-N layer;
a second electrode on and directly contacting the second side of the $Sc_xAl_{1-x}N$ layer; and
a third electrode on and directly contacting the second side of the $Sc_xAl_{1-x}N$ layer;
wherein:
the $Sc_xAl_{1-x}N$ layer comprises an aperture; and
the first electrode is disposed at least partially in the aperture.

15. The semiconductor device of claim 14, wherein the third electrode is electrically connected to the first electrode.

16. The semiconductor device of claim 14, wherein the $Sc_xAl_{1-x}N$ layer comprises a recess between the second electrode and the third electrode.

17. The semiconductor device of claim 14, wherein the second and third electrodes are part of an interdigital transducer.

18. The semiconductor device of claim 14, wherein the $Sc_xAl_{1-x}N$ layer, the second electrode, and the third electrode are part of a surface acoustic wave device.

* * * * *